(12) United States Patent
Chou et al.

(10) Patent No.: US 7,319,074 B2
(45) Date of Patent: Jan. 15, 2008

(54) METHOD OF DEFINING POLYSILICON PATTERNS

(75) Inventors: Pei-Yu Chou, Taipei Hsien (TW); Tong-Yu Chen, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 28 days.

(21) Appl. No.: 11/160,178

(22) Filed: Jun. 13, 2005

(65) Prior Publication Data
US 2006/0281325 A1    Dec. 14, 2006

(51) Int. Cl.
*H01L 21/302* (2006.01)
(52) U.S. Cl. ............ 438/717; 438/734; 438/736; 438/738
(58) Field of Classification Search ........ 438/717, 438/736, 738, 734
See application file for complete search history.

(56) References Cited

U.S. PATENT DOCUMENTS

| | | | |
|---|---|---|---|
| 5,804,088 A | 9/1998 | McKee | |
| 6,124,212 A * | 9/2000 | Fan et al. | 438/709 |
| 6,828,187 B1 | 12/2004 | Liu | |
| 2003/0082924 A1* | 5/2003 | Andideh et al. | 438/778 |
| 2003/0186492 A1 | 10/2003 | Brown | |
| 2004/0018739 A1* | 1/2004 | Abooameri et al. | 438/709 |
| 2005/0208773 A1* | 9/2005 | Huang et al. | 438/719 |

OTHER PUBLICATIONS

Silicon dioxide. Wikipedia, the free encyclopedia. http://en.wikipedia.org/wiki/Silica, Sep. 2006.*

* cited by examiner

*Primary Examiner*—Binh X. Tran
(74) *Attorney, Agent, or Firm*—Winston Hsu

(57) ABSTRACT

The present invention provides a method of defining polysilicon patterns. The method forms a polysilicon layer on a substrate, and a patterned mask on the polysilicon layer. Then, a first etching process is performed to remove a portion of the polysilicon layer not covered by the mask, thus forming a plurality of cavities in the polysilicon layer. A strip process is performed to strip the mask utilizing gases excluding $O_2$. Finally, a second etching process is performed to remove a portion of the polysilicon layer, thus extending the plurality of cavities down to a surface of the substrate.

17 Claims, 8 Drawing Sheets

METHOD OF DEFINING POLYSILICON PATTERNS

BACKGROUND OF THE INVENTION

1. Field of the Invention

The invention relates to a method of defining polysilicon patterns and more particularly, to a method of etching a polysilicon layer.

2. Description of the Prior Art

As technology progresses in semiconductor fields, it is a trend that N-poly and P-poly process integration is used to obtain different electric gate structures to satisfy the various needs of the semiconductor elements. Because the N-poly and P-poly areas have different dopings, they have different results in the process, such as the development of the line width of the semiconductor elements, the profile of the N-poly and P-poly, the after etch-inspection critical dimension (AEI CD), and uniformity of the etched gate oxide layer (GOX). Thus, it is important to provide an ideal method to define the N/P polysilicon patterns, approximate the profile and AEI CD of the N-poly and P-poly, and have enough thickness of the GOX after etching GOX.

Please refer to FIG. 1 and FIG. 2 that are schematic diagrams for defining polysilicon patterns according to prior art. As shown in FIG. 1, the method provides a substrate 10 and sequentially forms a gate oxide layer 12, a polysilicon layer 14, and a patterned mask 16 on the substrate 10. The polysilicon layer 14 includes a doping polysilicon layer 14a defined as a N-poly, and a non-doping polysilicon layer 14b defined as a P-poly, and the mask 16 is a photoresist layer or hard mask.

As shown in FIG. 2, an etching process is performed to remove a portion of the polysilicon layer 14 not covered by the mask 16. Because the etching rate of the doping polysilicon layer 14a is far faster than that of the non-doping polysilicon layer 14b, the sidewalls of the doping polysilicon layer 14a haveside cuts 18 so that the profile and AEI CD of N-poly cannot approximate the P-poly.

Please refer to FIG. 3 and FIG. 4 that are schematic diagrams for further defining polysilicon patterns according to prior art. As shown in FIG. 3, the method provides a substrate 30 and sequentially forms a gate oxide layer 32, a polysilicon layer 34, and a patterned mask 36 on the substrate 30. The polysilicon layer 34 includes various areas defined as N-poly and P-poly (not shown), a non-doping polysilicon layer 34a, and a doping polysilicon layer 34b formed on the non-doping polysilicon layer 34a. In addition, the mask 36 is a photoresist layer or hard mask.

As shown in FIG. 4, an etching process is performed to remove a portion of the polysilicon layer 34 not covered by the mask 36. Because the etching rate of the doping polysilicon layer 34b is far faster than that of the non-doping polysilicon layer 34a, the sides of the doping polysilicon layer 34b have side cuts 38.

Therefore, the applicant proposes a method of defining polysilicon patterns that can approximate the profile and AEI CD of the N-poly with the P-poly and make a large GOX pitting window to enhance the uniformity of the polysilicon patterns.

SUMMARY OF THE INVENTION

It is therefore a primary objective of the claimed invention to provide a method of defining polysilicon patterns to solve the above-mentioned problems.

According to the claimed invention, the method forms a polysilicon layer on a substrate and a patterned mask on the polysilicon layer. Then, a first etching process is performed to remove a portion of the polysilicon layer not covered by the mask, thus forming a plurality of cavities in the polysilicon layer. Furthermore, a strip process is performed to strip the mask utilizing gases excluding $O_2$. Finally, a second etching process is performed to remove a portion of the polysilicon layer, thus extending the plurality of cavities down to a surface of the substrate.

It is an advantage of the claimed invention that a two stage etching process is utilized to define a polysilicon layer. The method utilizes a photoresist mask to move a portion of polysilicon layer, which can approximate the profile and AEI CD of the N-poly with the P-poly. After removing the photoresist mask, the polysilicon layer extending down to the surface of the substrate is removed by the hard mask. Therefore, the present invention can approximate the profile and AEI CD of the N-poly with the P-poly and make large GOX pitting window to enhance the uniformity of the polysilicon patterns.

These and other objectives of the claimed invention will no doubt become obvious to those of ordinary skill in the art after reading the following detailed description of the preferred embodiment that is illustrated in the various figures and drawings These and other objectives of the present invention will no doubt become obvious to those of ordinary skill in the art after reading the following detailed description of the preferred embodiment that is illustrated in the various figures and drawings.

DETAILED DESCRIPTION

Figure 1:
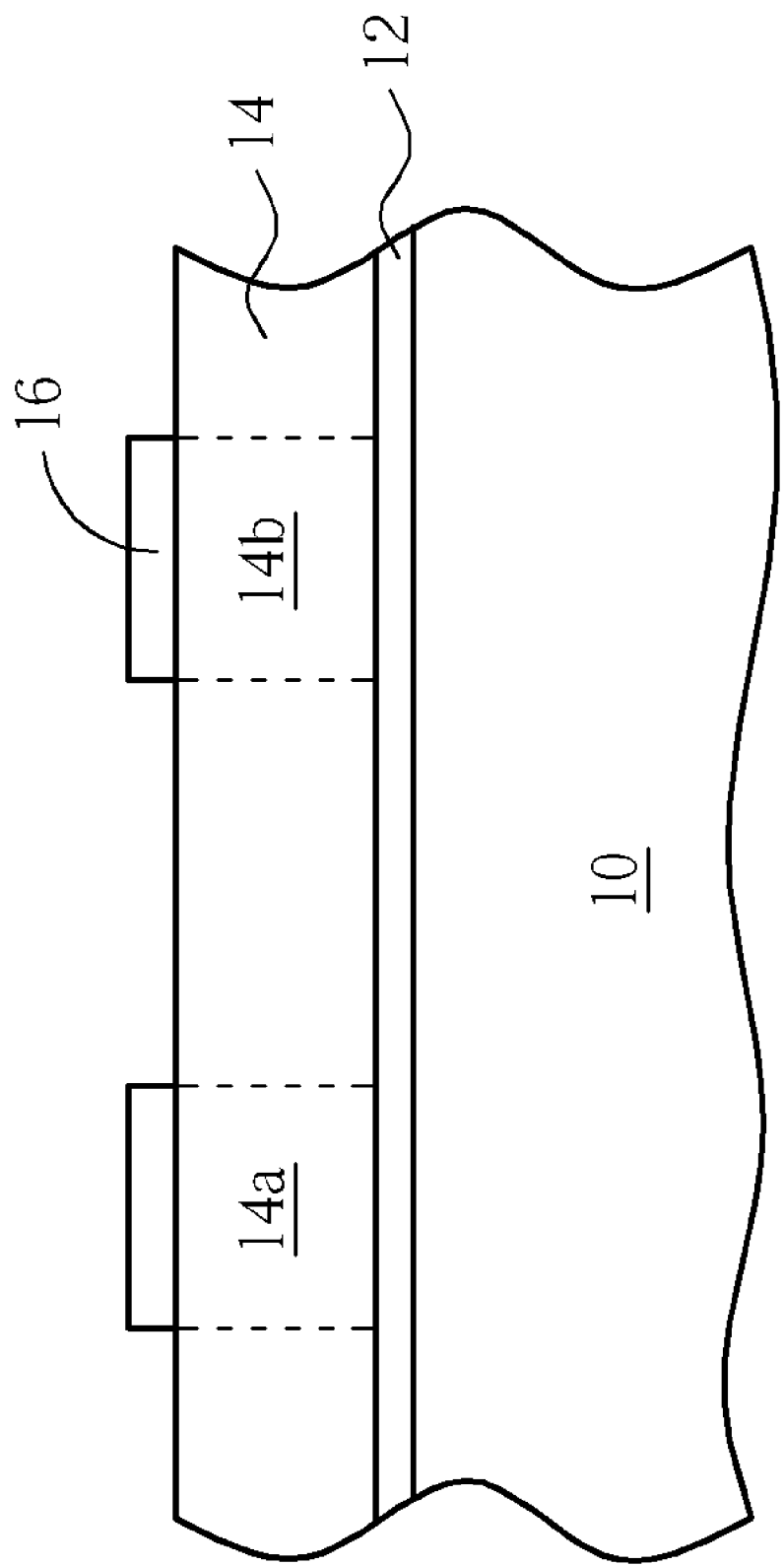
FIG. 1 to FIG. 4 are schematic diagrams for defining polysilicon patterns according to prior art.
Figure 2:
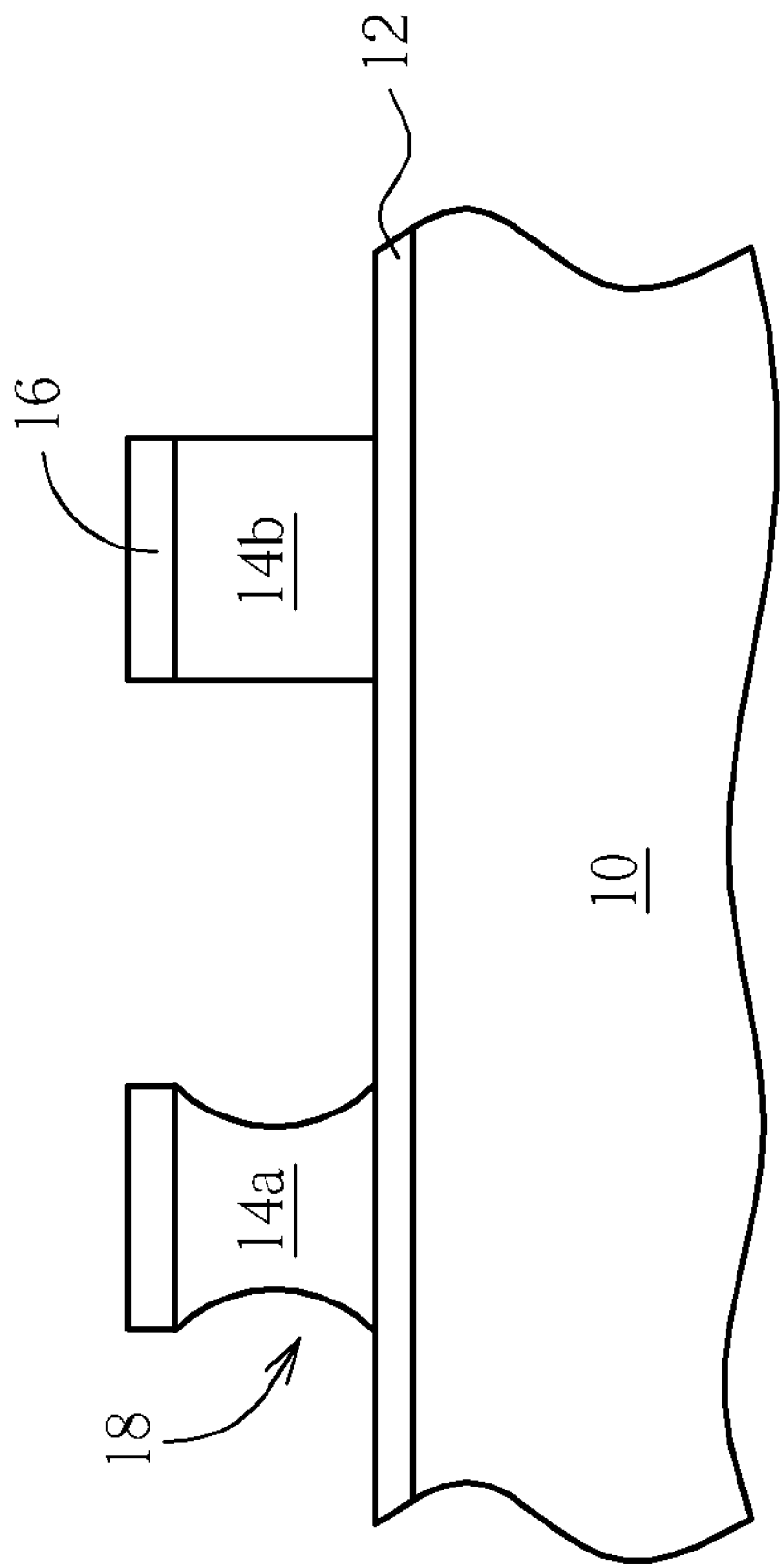
Figure 3:
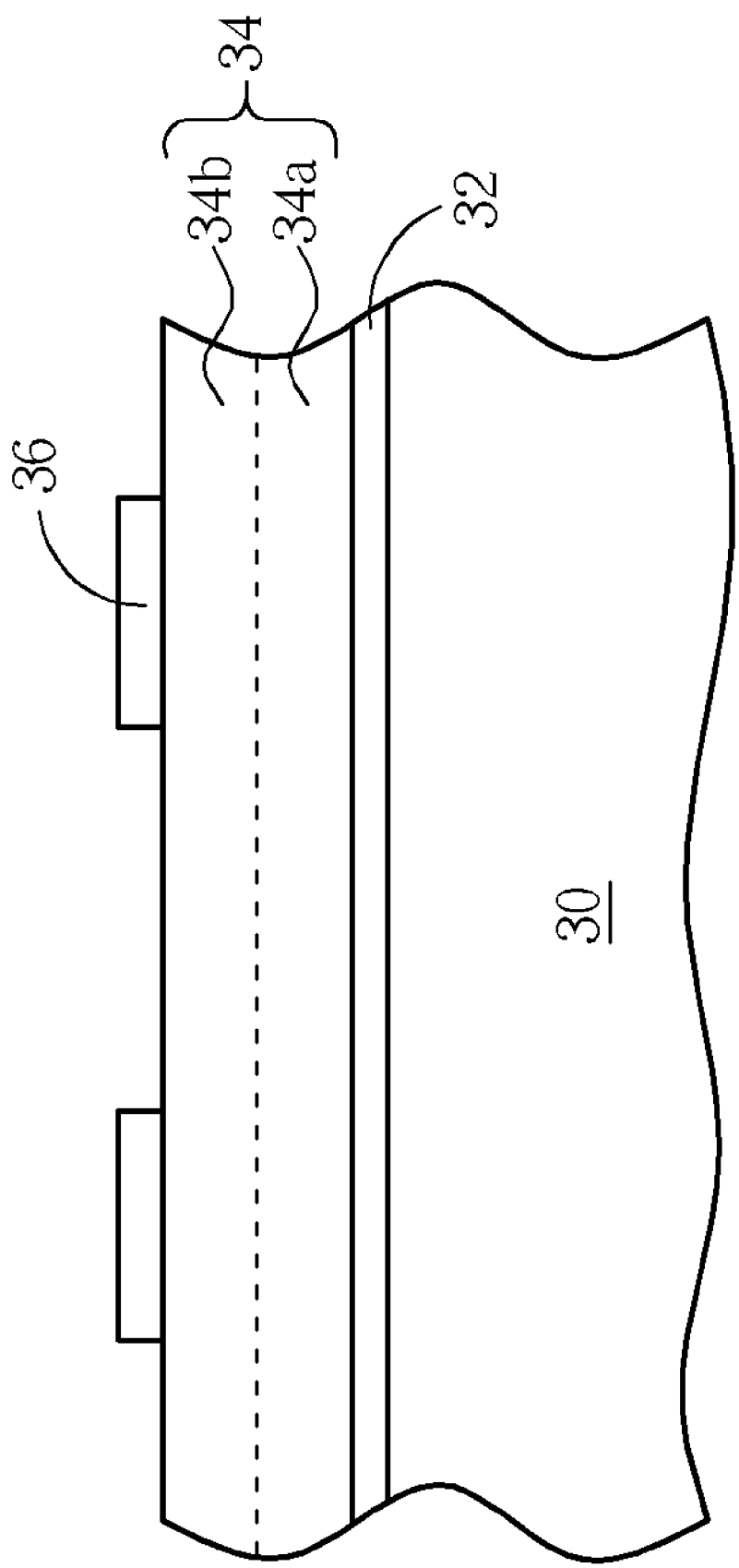
Figure 4:
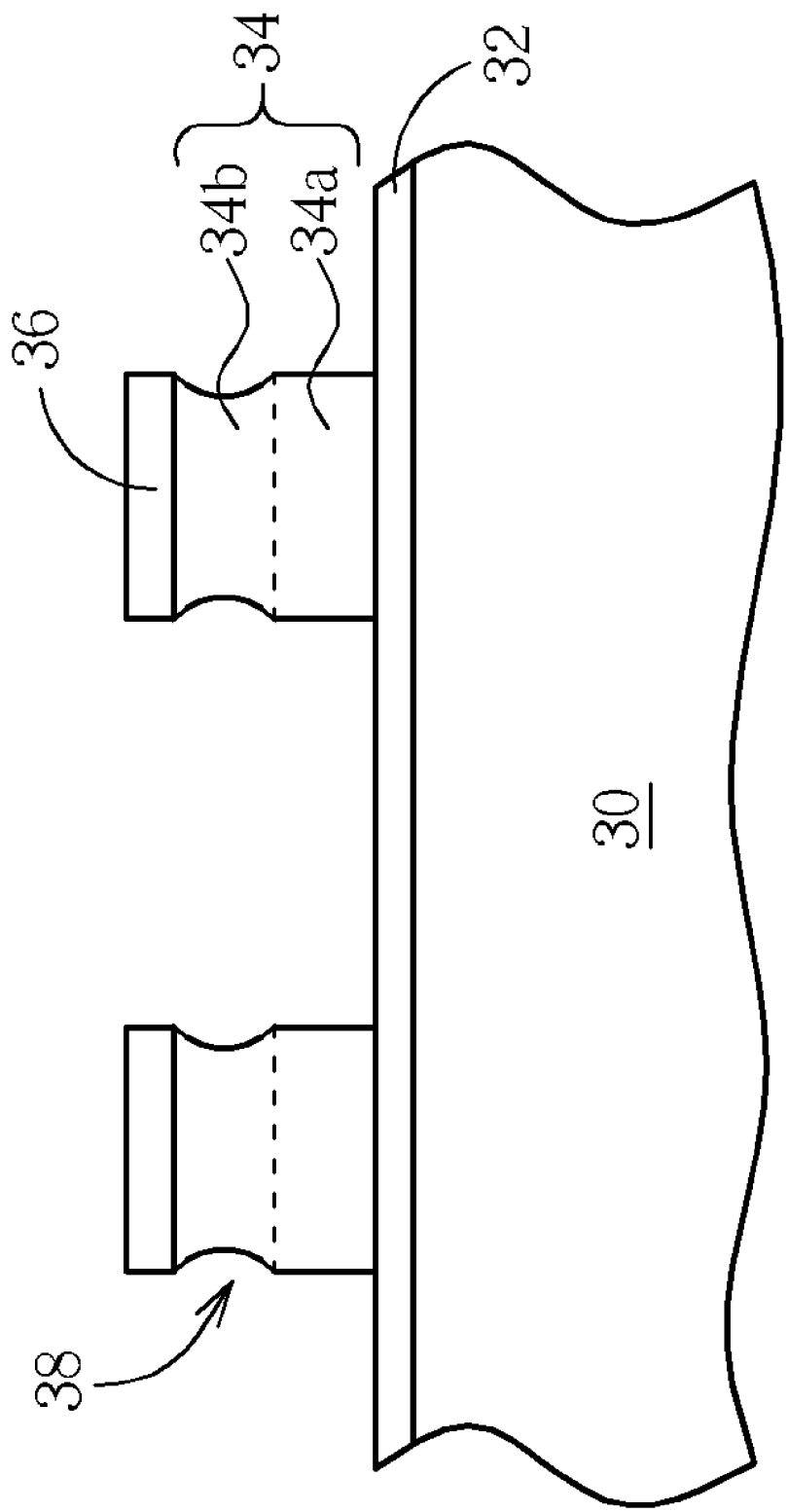
Figure 5:
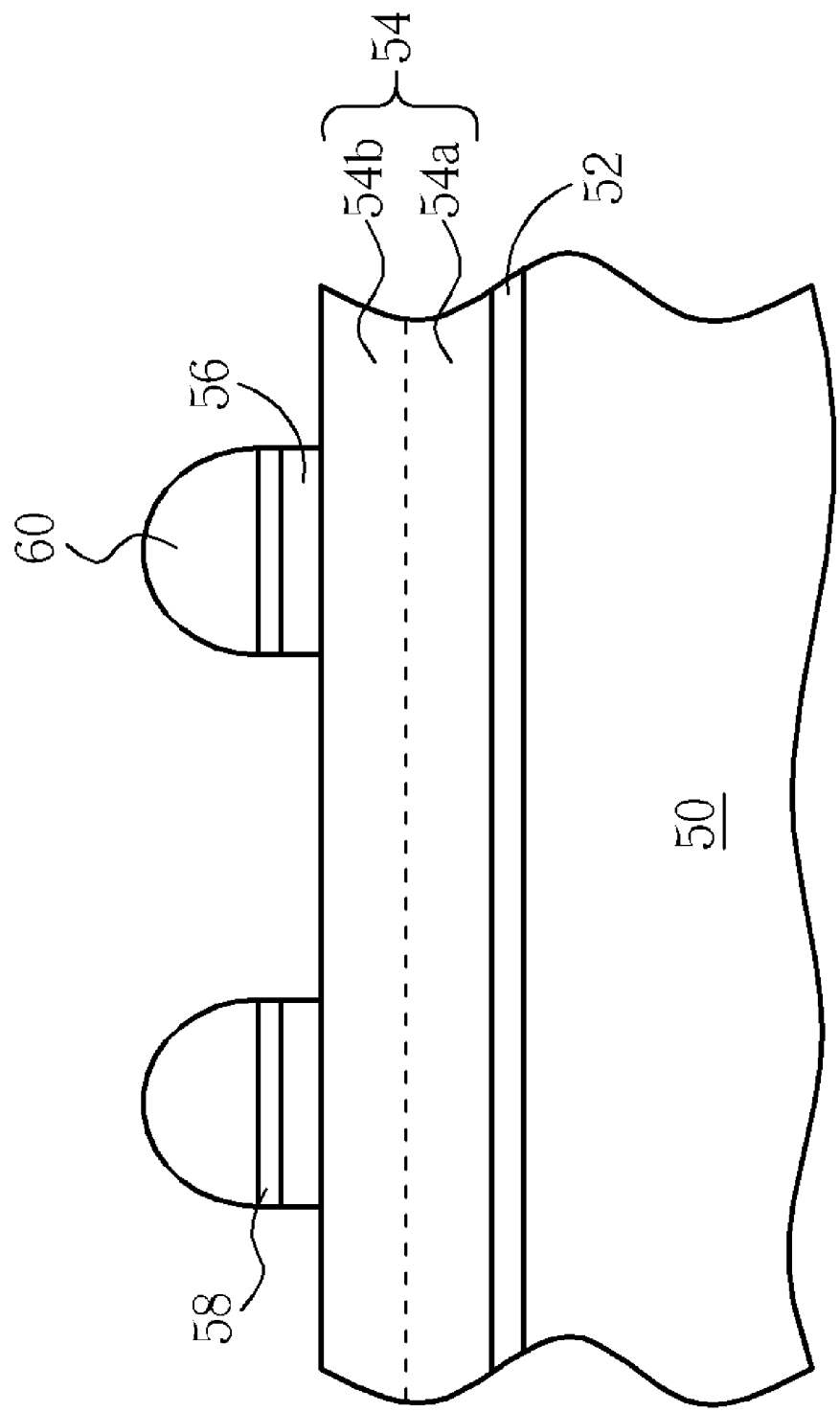
FIG. 5 to FIG. 8 are schematic diagrams for further defining polysilicon patterns according to present invention.

Please refer to FIG. 5 to FIG. 8 that are schematic diagrams for further defining polysilicon patterns according to present invention. As shown in FIG. 5, the present invention forms a gate oxide layer 52 on a substrate 50, such as silicon substrate, a polysilicon layer 54 on the gate oxide layer 52, and a patterned photoresist mask 60, such as photoresist, on the polysilicon layer 54. In addition, the present invention need to form a hard mask 56, and can selectively form a bottom anti-reflection layer (BARC) 58, or/and other material layers between the photoresist mask 60 and the polysilicon layer 54 to form a patterned composite material mask layer for defining a plurality of cavities.

The polysilicon layer 54 includes various areas defined as N-poly and P-poly, a non-doping polysilicon layer 54a, and doping polysilicon layer 54b on the polysilicon layer 54a. The doping polysilicon layer 54b can be N-type doped by utilizing nitride or phosphorous atoms. The material of hard mask 56 can be dielectric, silicon oxide ($SiO2$), silicon nitride ($Si_3N_4$), silicon-oxy-nitride ($SiOxNy$), phospho silicate (PSG), borophospho-silicate (BPSG), siloxznes, or carbide ($\alpha$-C) and the BARC 58 can be a silicon oxide layer, organic compounds (hydrocarbon), or tetra-ethyl-ortho-silicate (TEOS).

Figure 6:
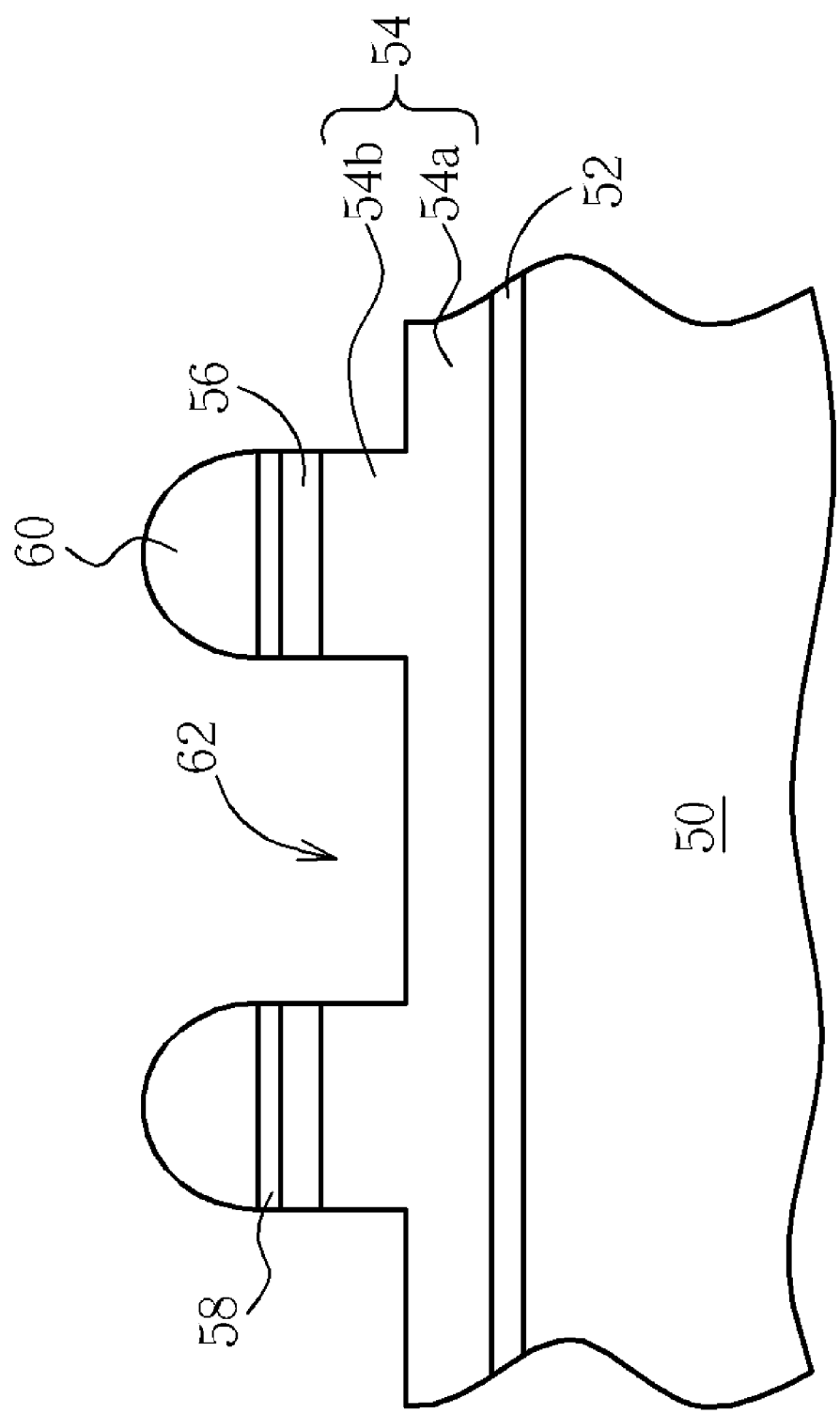

Then, as shown in FIG. 6, a first etching process is performed to remove a portion of polysilicon layer 54 not covered by the photoresist mask 60, thus forming a plurality of cavities 62 in the polysilicon layer. In the first etching process according to present invention, the portion of polysilicon layer 54 removed is the doping polysilicon layer 54b not covered by the photoresist mask 60, exposing the non-doping polysilicon layer 54a. The generated plasmer of the etching gases reacts with the photoresist mask 60, which produce rich polymer deposited on the sidewalls of the polysilicon layer 54 to protect the sidewalls of the doping polysilicon layer 54b from the indentation or side cut of the sidewalls by a fast etching rate.

Figure 7:
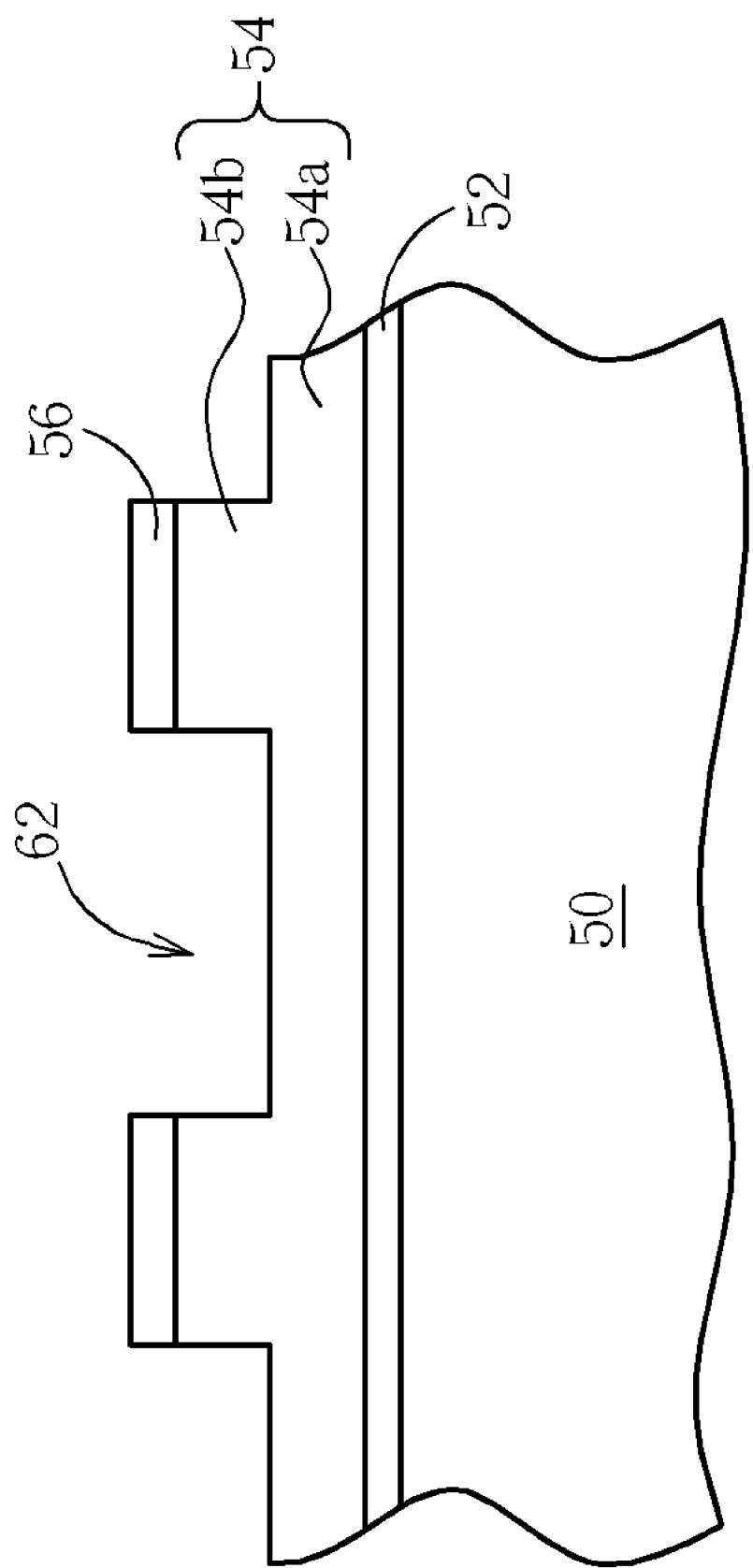

After, as shown in FIG. 7, a strip process is performed to strip the photoresist mask 60 and the BARC 58 utilizing gases excluding $O_2$, such as $H_2$ or/and $N_2$, and the hard mask 56 being used as a mask in the latter process, is retained on the polysilicon layer 54. If the photoresist mask 60 and the BARC 58 is striped utilizing $O_2$, the $O_2$ easily reacts with the surface of the polysilicon layer 54 and generates oxide that causes problems in the latter etching process. Therefore, the present invention utilizes $H_2$, $N_2$, Ar, He or other dilute gases to strip the photoresist and avoids generated oxide remaining on the surface of the polysilicon layer.

Figure 8:
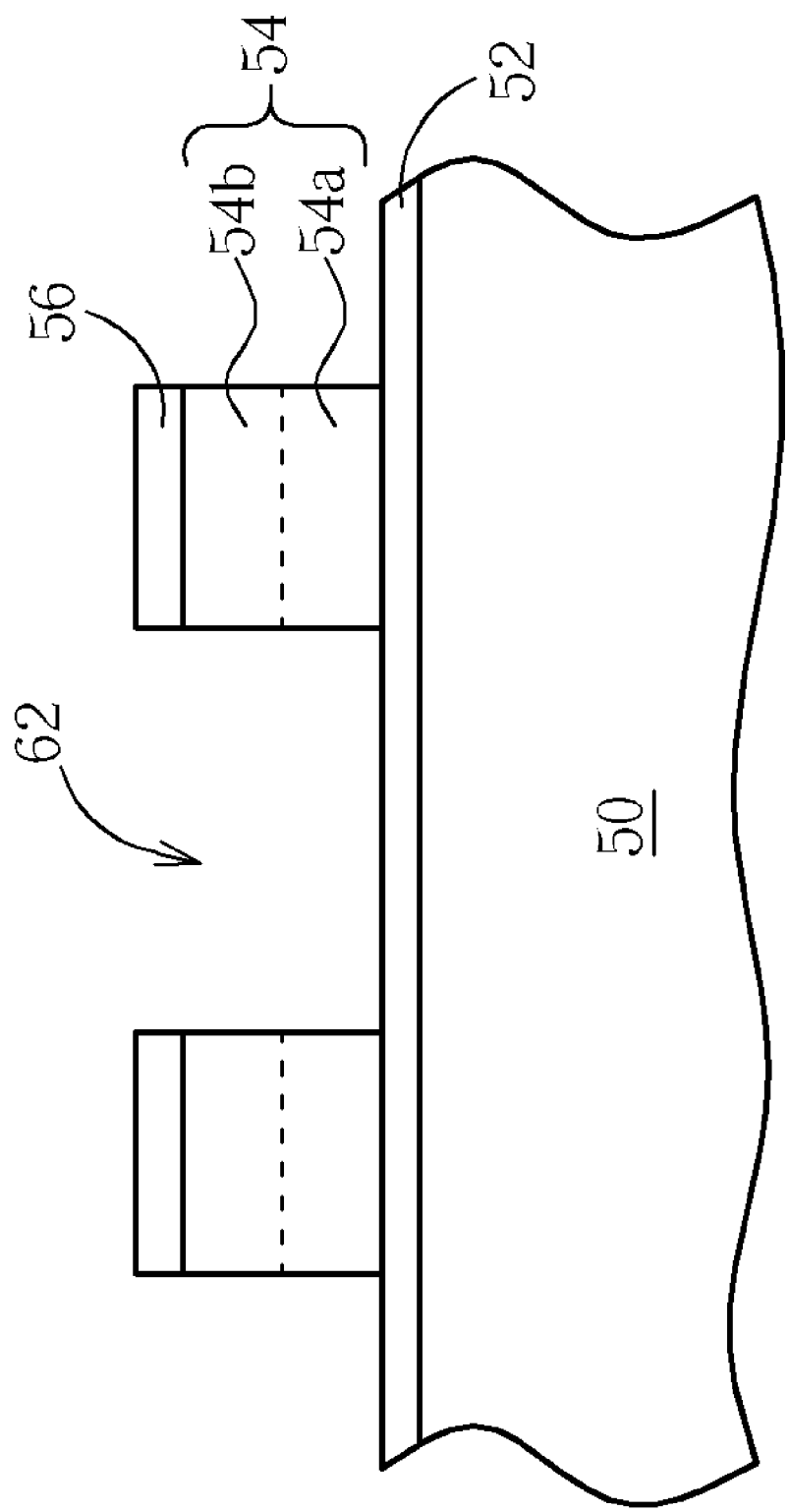

Finally, as shown in FIG. 8, a second etching process is performed to remove the exposed nan-doping polysilicon layer 54a extending the plurality of cavities 62 down to a surface of the substrate, and then a plurality of polysilicon gate patterns are defined. In other words, the second etching process and strip process can be regarded to in-situ or not in-situ be performed.

The present invention utilizes a two stage etching process to define polysilicon layer patterns, including the photoresist mask 60 that is used for the etching mask to remove a portion of doping polysilicon layer 54b which can provide rich polymer and may be defined as a N-poly and P-poly areas. After the profiles and AEI CDs of N-poly and P-poly areas in the doping polysilicon layer 54b are similar, the photoresist layer and the BARC are removed. Then the hard mask 56 is used for a mask for the second stage etching process to continue removal of the polysilicon layer 54 to obtain better profile of polysilicon.

In addition, because the present invention utilizes both the mask (photoresist layer) 60 and the hard mask 56 to define the polysilicon patterns, problems incurred using a single mask are avoided, whether the single mask is a photoresist layer or a hard mask. For example, only using the photoresist layer, the photoresist layer reacts with the etching gases and then the polymers are deposited on the sidewalls of the polysilicon layer, so the activating fluorine (F.) remain on photoresist layer and the polymer layer. Only using the hard mask to define the polysilicon pattern can solve the GOX pitting issue but loses the deposited polymer to protect the sidewalls of doping polysilicon (N-poly), causing different profiles and AEI CDs of the N-poly and P-poly areas.

In summation, the method of defining polysilicon patterns utilizes both the photoresist layer and hard mask for the mask of etching processes, and uses gases excluding $O_2$ to strip photoresist according to the present invention. Not only does the method produce similar profiles and AEI CDs for the N-poly and P-poly as defined by the photoresist layer, but it also has a smaller line width process and avoids GOX pitting issues by utilizing the hard mask to define the polysilicon layer. Therefore, the present invention can enhance the quality and yield of the semiconductor elements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of defining polysilicon patterns, the method comprising:
   providing a substrate;
   forming a polysilicon layer on the substrate and a patterned mask on the polysilicon layer, wherein the polysilicon layer comprises a doping polysilicon layer and a non-doping polysilicon layer under the doping polysilicon layer;
   performing a first etching process to remove a portion of the doping polysilicon layer not covered by the patterned mask, a plurality of cavities formed in the polysilicon layer;
   performing a strip process to strip the mask utilizing gases excluding oxygen; and
   performing a second etching process after the strip process to remove a portion of the non-doping polysilicon layer, extending the plurality of cavities down to a surface of the substrate.

2. The method of the claim 1, wherein the mask comprises a photoresist layer.

3. The method of the claim 1, wherein the substrate further comprises a gate oxide layer deposited under the polysilicon layer.

4. The method of the claim 1, wherein the substrate is a silicon substrate.

5. The method of the claim 1, wherein the doping polysilicon layer is an N-poly.

6. The method of the claim 1, wherein the utilized gases in the strip process are hydrogen, nitrogen, argon, or helium.

7. The method of the claim 1, wherein the strip and the second etching process are in-situ processed.

8. The method of the claim 1, wherein the strip and the second etching process are not in-situ processed.

9. The method of the claim 1 further comprising forming a hard mask on the polysilicon layer, for a mask of the second etching process.

10. The method of the claim 9, wherein the material of the hard mask is dielectric, silicon dioxide (SiO2), silicon nitride ($Si_3N_4$), silicon-oxy-nitride (SiOxNy), phospho silicate (PSG), borophospho-silicate (BPSG), siloxanes, or carbide ($\alpha$-C).

11. A method for defining polysilicon patterns, the method comprising:
    providing a substrate;
    forming a gate oxide layer on the substrate, a polysilicon layer on the gate oxide layer, a hard mask on the polysilicon layer, a bottom anti-reflection layer on the hard mask, and a photoresist layer on the bottom anti-reflection layer, wherein the hard mask , the bottom anti-reflection layer, and the photoresist layer has the same pattern and forms a patterned mask on the polysilicon layer;
        wherein the polysilicon layer comprises a doping polysilicon layer and a non-doping polysilicon layer under the doping polysilicon layer;
    performing a first etching process to remove a portion of the doping polysilicon layer not covered by the patterned mask, a plurality of cavities formed in the polysilicon layer;
    performing a strip process to strip the photoresist layer and the bottom anti-reflection layer utilizing gases excluding oxygen, the hard mask remaining on the surface of the polysilicon layer; and performing a second etching process after the strip process to remove a portion of the non-doping polysilicon layer, extending the plurality of cavities down to a surface of the substrate.

12. The method of the claim 11, wherein the material of the hard mask is dielectric, silicon dioxide (SiO2), silicon nitride (Si$_3$N$_4$), silicon-oxy-nitride (SiOxNy), phospho silicate (PSG), borophospho-silicate (BPSG), siloxanes, or carbide (α-C).

13. The method of the claim 11, wherein the substrate is a silicon substrate.

14. The method of the claim 11, wherein the doping polysilicon layer is a N-poly.

15. The method of the claim 11, wherein the utilized gases are hydrogen, nitrogen, argon, or helium.

16. The method of the claim 11, wherein the strip and the second etching process are in-situ processed.

17. The method of the claim 11, wherein the strip and the second etching process are not in-situ processed.

* * * * *